United States Patent
Marlin

(10) Patent No.: US 6,429,046 B1
(45) Date of Patent: Aug. 6, 2002

(54) FLIP CHIP DEVICE AND METHOD OF MANUFACTURE

(75) Inventor: George W. Marlin, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/615,865

(22) Filed: Jul. 13, 2000

(51) Int. Cl.$^7$ ............................................... H01L 21/44
(52) U.S. Cl. ........................................ 438/108; 257/778
(58) Field of Search .................. 228/254, 83; 438/614, 438/613, 108, 612; 148/400; 257/780, 733, 738, 778, 779

(56) References Cited

U.S. PATENT DOCUMENTS

| | | | | |
|---|---|---|---|---|
| 5,108,027 A | * | 4/1992 | Warner et al. | 228/254 |
| 5,736,456 A | * | 4/1998 | Akram | 438/614 |
| 6,095,397 A | * | 8/2000 | Wolf et al. | 228/83 |
| 6,224,690 B1 | * | 5/2001 | Andricados et al. | 148/400 |
| 6,281,107 B1 | * | 8/2001 | Moriyama | 438/613 |

* cited by examiner

*Primary Examiner*—David Nelms
*Assistant Examiner*—Bau T Le
(74) *Attorney, Agent, or Firm*—Charles W. Bethards; Mark J. Fink

(57) ABSTRACT

A method of manufacturing a solder bump on a power copper structure and resultant device is disclosed. In the method, a layer of an electrically conductive, non-wettable material such as TiW is applied over a power copper structure. Then, solder bumps are formed on the non-wettable layer. The presence of the non-wettable layer prevents the collapse of the solder bumps when heated.

10 Claims, 2 Drawing Sheets

FLIP CHIP DEVICE AND METHOD OF MANUFACTURE

FIELD OF THE INVENTION

This invention relates, in general, to semiconductor devices, and more particularly, to a method for a flip chip device and method of manufacture.

BACKGROUND OF THE INVENTION

As the need for smaller and more efficient semiconductor devices increases, the desirability of using power copper structure in those devices also increases. This is due to the fact that power copper devices dissipate heat more efficiently than other devices. Also, power copper devices have relatively thick copper structures which have a lower impedance than typical semiconductor aluminum interconnections.

Not only is there a demand for power copper devices, there is also an interest in power copper devices which can be packaged as flip chips. A flip chip is a semiconductor that has solder pads built on and, therefore, can be directly soldered onto another component instead of using wire bonding or similar technique. However, combining the two technologies, power copper and flip chip design, has proven difficult.

One proposed solution is to place solder directly onto the power copper structure. However, when this approach is used, the solder bumps collapse during assembly to the substrate. This is because copper is a wettable surface which causes the solder bump to collapse and spread out over the copper. To avoid solder bump collapse, adding a layer of polyimide has been proposed. However, the polyimide does not adhere well to metals and contains polyimide acids which work to cause copper dissolution in the power copper structure. Clearly a need exists for solutions to the aforementioned problems.

BRIEF DESCRIPTION OF THE DRAWINGS

For a more complete understanding of the present invention and the advantages thereof, reference is now made to the following brief description, taken in conjunction with the accompanying drawings and detailed description, wherein like reference numerals represent like parts, in which.

DETAILED DESCRIPTION OF THE PREFERRED EMBODIMENT

Figure 1:
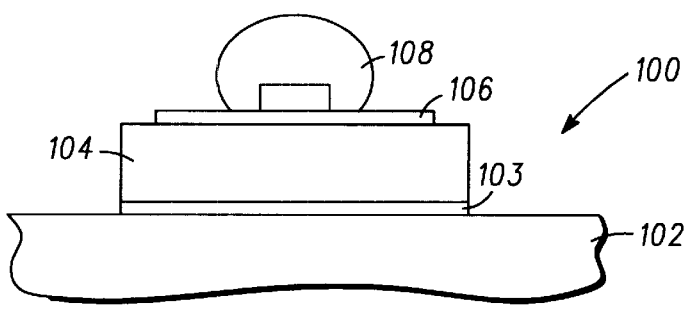
FIG. 1 illustrates a semiconductor device having a solder contact in accordance with the teachings of the present invention.

FIG. 1 illustrates a semiconductor device having a flip chip solder bump in accordance with the teachings of the present invention. In FIG. 1, power copper 104 overlies the semiconductor chip 102. On top of the power copper 104 is a non-wettable layer 106, preferably comprising a titanium-tungsten mixture (TiW). On top of that layer is solder bump 108. This embodiment discloses a workable semiconductor device having a power copper structure in a flip chip design. Solder bump 108 can be directly attached to another device or circuit without the need for any type of wire bonding. Thus, the advantages of a power copper flip chip (such as lower connection impedance as well as greater heat dissipation at minimized scale) can be realized.

In one embodiment, an adherence layer 103 lies between the power copper 104 and the semiconductor chip 102. This layer acts as a glue layer that adheres well to the materials on the chip and to the bump, as well as preventing diffusion of materials from the bump structure into the chip 102. In one embodiment adherence layer 103 comprises a layer of TiW. The power copper 104 is typically applied using a plating process. While TiW is used as an exemplary non-wettable layer 106 between power copper 104 and the solder bump 108, one skilled in the art can recognize that other non-wettable, electrically conductive materials such as titanium, aluminum, vanadium, chromium photo-imageable sputtered film and others, can be used. Solder bump 108 in one embodiment is lead-tin solder although one skilled in the art can recognize that other types of solder can be utilized including lead-indium and tin-silver solder.

Figure 2:
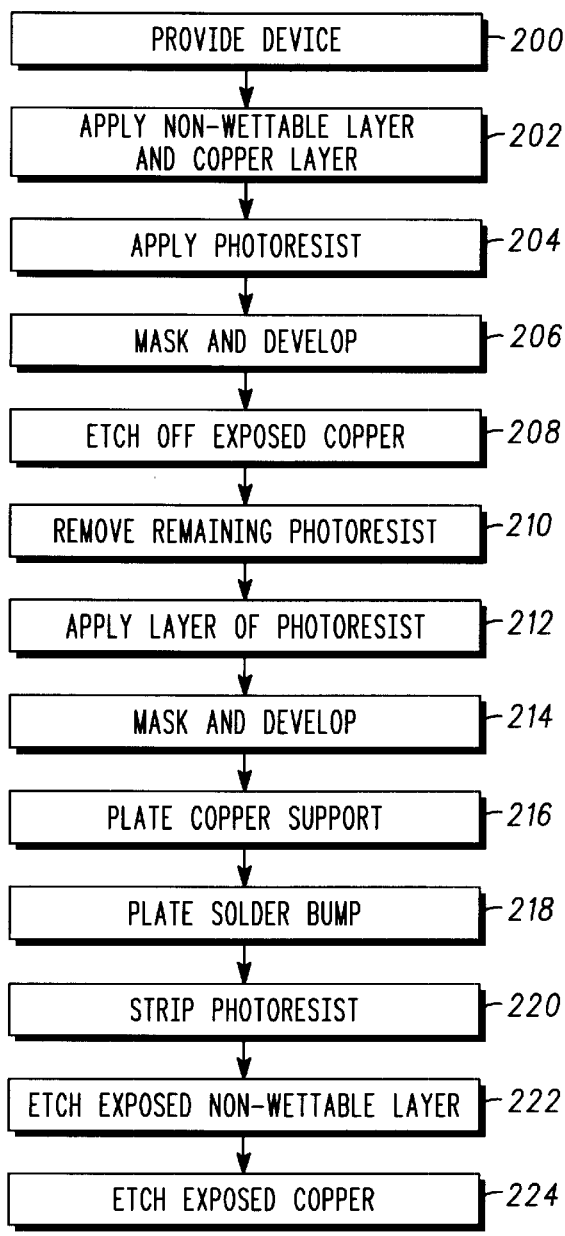
FIG. 2 is a flow chart illustrating the method of manufacturing a device in accordance with the teachings of the present invention.
Figure 3:
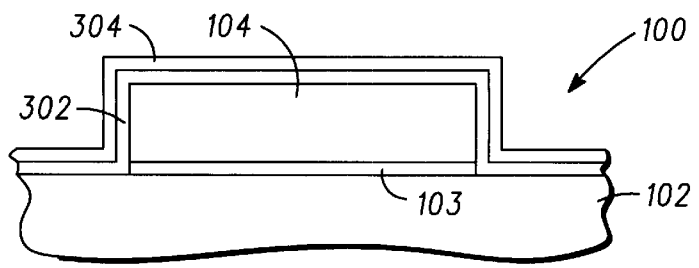
FIGS. 3–6 illustrate the flip chip device at various stages of manufacture.

FIG. 2 is a flow chart illustrating the method of manufacturing the device of FIG. 1 in accordance with the teachings of the present invention. In step 200, a semiconductor device having a power copper structure is provided. In step 202, a non-wettable layer 106, in one embodiment comprising TiW, is applied by a sputtering technique. On top of that layer, a second metal layer, which in one embodiment is copper (Cu), is applied using a sputtering technique. The result is illustrated in FIG. 3. Illustrated is the semiconductor device 102 with the power copper structure 104. The non-wettable layer 302 of TiW (or other non-wettable material) is applied first and then a second metal 304 is applied. The second metal layer, in one embodiment, is copper. However, any other wettable metal such as gold, nickel, silver, or chromium-silver can be used, as long as the material helps prevent oxidation of the non-wettable layer, adheres well to adjacent layers, and is electrically conductive.

Figure 4:
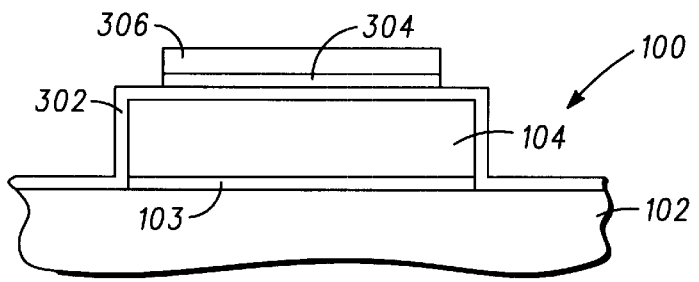

Next, in step 204, a layer of photoresist is applied. In one embodiment, the photoresist coat is 12 microns in thickness. After applying the photoresist, in step 206, a mask is applied and developed using conventional photolithography techniques. This mask will serve to remove the photoresist layer surrounding the power copper, and leave photoresist overlying all or a portion of the power copper structures. Then the metal layer that was sputtered on in step 202 is etched off everywhere except for in the area under the remaining photoresist, in step 208. The result is illustrated in FIG. 4. All of metal layer 304 has been removed except that under photoresist 306. Non-wettable layer 302 is still present.

Figure 5:
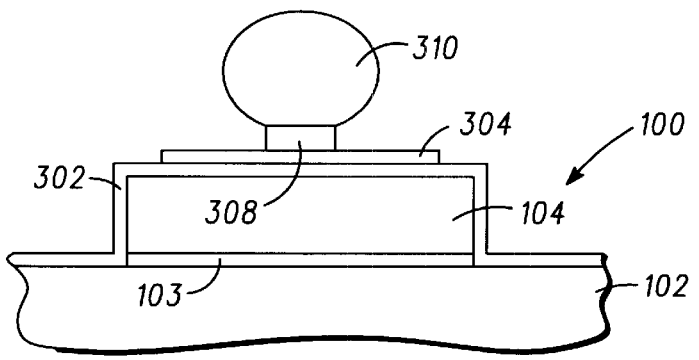

The remaining photoresist is then stripped in step 210. Another layer of photoresist is applied in step 212. In one embodiment, this layer of photoresist is approximately 12 microns in thickness. Then, a mask with an opening to define the location and size of the solder bump is applied and developed using conventional photolithography techniques, in step 214. In the opening formed in the photolithic development step of 214, a support stud is optionally plated in step 216. The support stud contacts the metal layer that was sputtered on and remained after removing the photoresist in step 210. In one embodiment the support stud is manufactured from copper although different metals such as gold or nickel can be used. Next, in step 218, a solder bump is plated onto the support stud. If the support stud is not used, the solder bump is directly plated. In step 220, the photoresist remaining is stripped off. The result is illustrated in FIG. 5. A support stud 308 and a solder bump 310 are seen in this figure. Solder bump 310 will be used to connect to another device or substrate.

Figure 6:
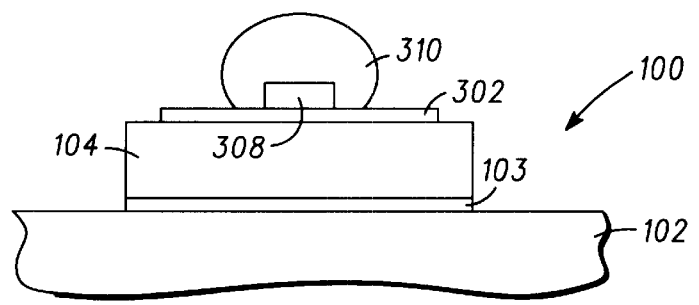

The non-wettable layer is etched off in step 222. This will remove all of the non-wettable layer except that formed underneath the remaining metal layer. Then, in step 224, all of the remaining metal layer that was sputtered on in step 202 is removed by etching. This layer is etched long enough to remove the metal layer that was added in step 202, but not long enough to significantly etch the support stud. Etching of this type is well known in the art. After heating and reflowing, the solder bump will envelope the support stud but will maintain the proper shape for use in bonding because of the presence of non-wettable layer. The structure as illustrated in FIG. 6 is obtained.

Therefore, because of the non-wettable surface surrounding the solder bump, it will not collapse and will stay in a proper configuration under heating and reflowing. Additionally, the materials used will not dissolve the copper power structure, which can occur when polyimide layers are used as was discussed in the background of the invention.

What is claimed is:

1. A method of manufacturing a flip-chip device comprising:

providing a copper structure formed over a semiconductor device;

applying an electrically conductive non-wettable layer over the power copper structure;

applying a wettable stud over the electrically conductive non-wettable layer; and applying a solder bump to the wettable stud.

2. The method of claim 1, wherein the step of applying a layer of non-wettable material comprises applying a TiW layer.

3. A method of manufacturing a non-wettable surface for use in a flip-chip device comprising:

providing a power copper structure; and applying an electrically conductive non-wettable layer over the power copper structure, wherein the step of applying a layer of non-wettable material comprises applying a TiW layer; and wherein the step of applying a layer of TiW further comprises:

sputtering a layer of TiW;

sputtering a layer of copper over the layer of TiW;

depositing a layer of photoresist over the layer of copper;

using an appropriate mask and developing the mask image to remove photoresist from everywhere except over a portion of the power copper structure;

removing the layer of copper from all exposed areas; and removing the remaining photoresist.

4. The method of claim 1, further comprising sputtering a wettable layer over the non-wettable layer.

5. A method of manufacturing a non-wettable surface for use in a flip-chip device comprising:

providing a power copper structure;

applying an electrically conductive non-wettable layer over the power copper structure;

and forming a solder bump over the non-wettable layer, wherein the step of forming a solder bump comprises:

coating the device with photoresist;

forming an opening in the photoresist over the power copper structure;

plating a copper stud;

plating solder on the copper stud;

striping the photoresist; and etching the TiW and copper layers.

6. A semiconductor flip chip device comprising;

a power copper structure formed over a semiconductor device;

an electrically conductive non-wettable layer formed over the power copper structure;

a wettable stud formed with the electrically conductive non-wettable layer; and a solder bump formed to the wettable stud.

7. The semiconductor flip chip device of claim 6, wherein the device has an adherence layer between the power copper structure and the semiconductor device.

8. The semiconductor flip chip device of claim 6, wherein the non-wettable material is TiW.

9. The semiconductor flip chip device of claim 6, wherein the solder bump comprises lead-tin.

10. The semiconductor flip chip device of claim 6, wherein the adherence layer comprises TiW.

* * * * *